(12) United States Patent
Zenko et al.

(10) Patent No.: US 6,693,237 B2
(45) Date of Patent: Feb. 17, 2004

(54) SEALING COMPOSITION FOR SEALING SOLAR CELL, AND SOLAR CELL MODULE AND BUILDING MATERIAL-INTEGRAL TYPE SOLAR CELL MODULE USING SAID COMPOSITION

(75) Inventors: Hideaki Zenko, Kanagawa (JP); Ichiro Kataoka, Nara (JP); Satoru Yamada, Nara (JP); Hidenori Shiotsuka, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 74 days.

(21) Appl. No.: 09/862,329

(22) Filed: May 23, 2001

(65) Prior Publication Data

US 2002/0038664 A1 Apr. 4, 2002

(30) Foreign Application Priority Data

May 23, 2000 (JP) .......................... 2000-151046

(51) Int. Cl.⁷ .................. H01L 31/048; H01L 23/29
(52) U.S. Cl. .................. 136/251; 136/259; 257/433; 257/788
(58) Field of Search ................. 136/251, 252, 136/259; 257/433, 787, 788, 790; 525/50

(56) References Cited

U.S. PATENT DOCUMENTS

| | | | |
|---|---|---|---|
| 5,578,141 A | 11/1996 | Mori et al. ............... | 136/251 |
| 5,660,646 A | 8/1997 | Kataoka et al. ............ | 136/251 |
| 5,663,236 A * | 9/1997 | Takahashi et al. ........... | 525/240 |
| 5,684,325 A | 11/1997 | Kataoka et al. ............. | 257/433 |
| 5,718,772 A | 2/1998 | Mori et al. ................. | 136/251 |
| 5,973,258 A | 10/1999 | Shiotsuka et al. .......... | 136/252 |
| 6,353,042 B1 * | 3/2002 | Hanoka et al. ............. | 523/207 |
| 6,355,727 B1 * | 3/2002 | Andrist et al. ............. | 525/75 |
| 2001/0045228 A1 * | 11/2001 | Takada et al. .............. | 136/244 |

FOREIGN PATENT DOCUMENTS

| | | |
|---|---|---|
| EP | 0 836 233 | 4/1998 |
| JP | 58-060579 | 4/1983 |
| JP | 2-199144 A * | 8/1990 |
| JP | 10-112549 | 4/1998 |

OTHER PUBLICATIONS

Material Safety Data Sheet (Honeywell), "A–C Ethylene–Vinyl Acetate Copolymers", Feb. 2000.*
http://www.plasticsusa.com/eva.html.*
http://www.tfx.com/reference/materials.htm.*
Material Safety Data Sheet (Formosa Plastics Corporation, Texas), "Polypropylene", Dec. 2000.*
Material Safety Data Sheet, "Polypropylene", Nov. 20, 1999.*
Material Safety Data Sheet (City Plastics), "Polypropylene", Jul. 1, 2000.*
Lieberman, Richard B. "POLYPROPYLENE" Kirk–Othmer Encyclopedia of Chemical Technology. 1996. Table 1.*
U.S. patent application Ser. No. 09/605,754, filed Jun. 28, 2000.

* cited by examiner

*Primary Examiner*—Nam Nguyen
*Assistant Examiner*—Brian L Mutschler
(74) *Attorney, Agent, or Firm*—Fitzpatrick, Cella, Harper & Scinto

(57) ABSTRACT

The present invention relates to a solar cell module and a building-integrated solar cell module having a sealing composition made of a polymer blend or a polymer alloy. The blend or alloy is made of at least one polyolefin series copolymer and at least one crystalline polyolefin. The copolymer has a fusing point Ta by a differential scanning calorimetry which fall in a range of 50 to 110° C. The crystalline polyolefin has a fusing point Tb by a differential scanning calorimetry which falls in a range of from 110 to 170° C.

10 Claims, 8 Drawing Sheets

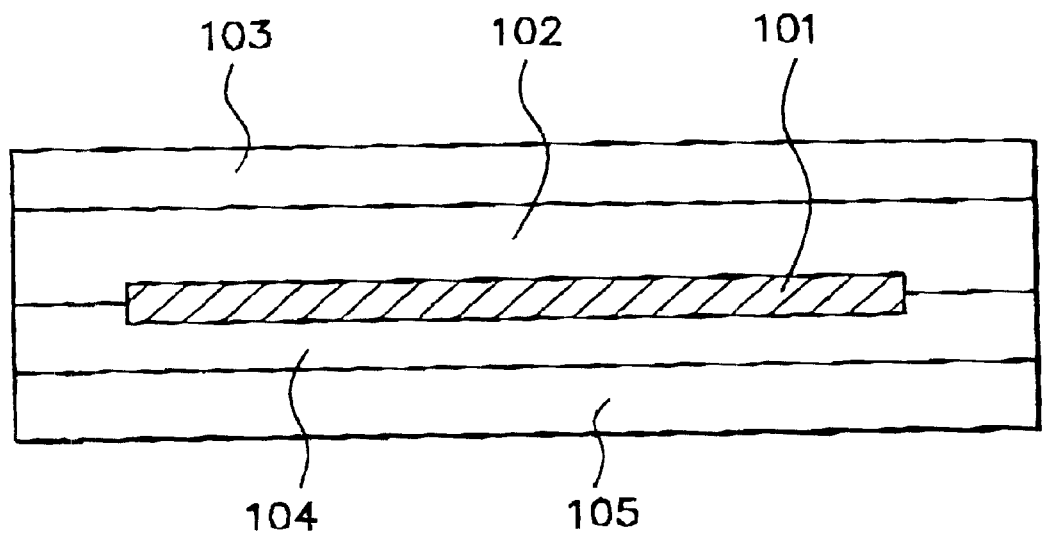

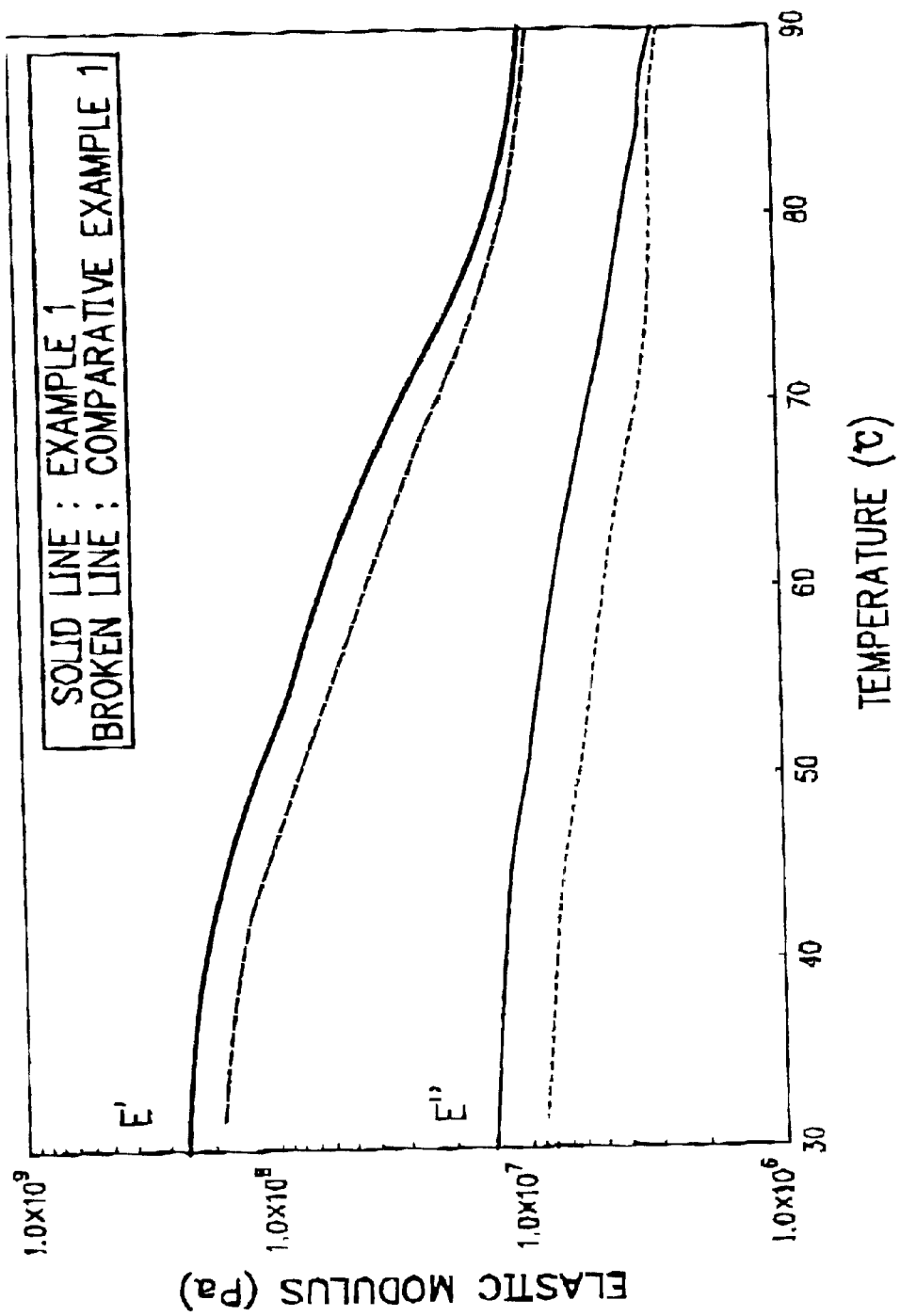

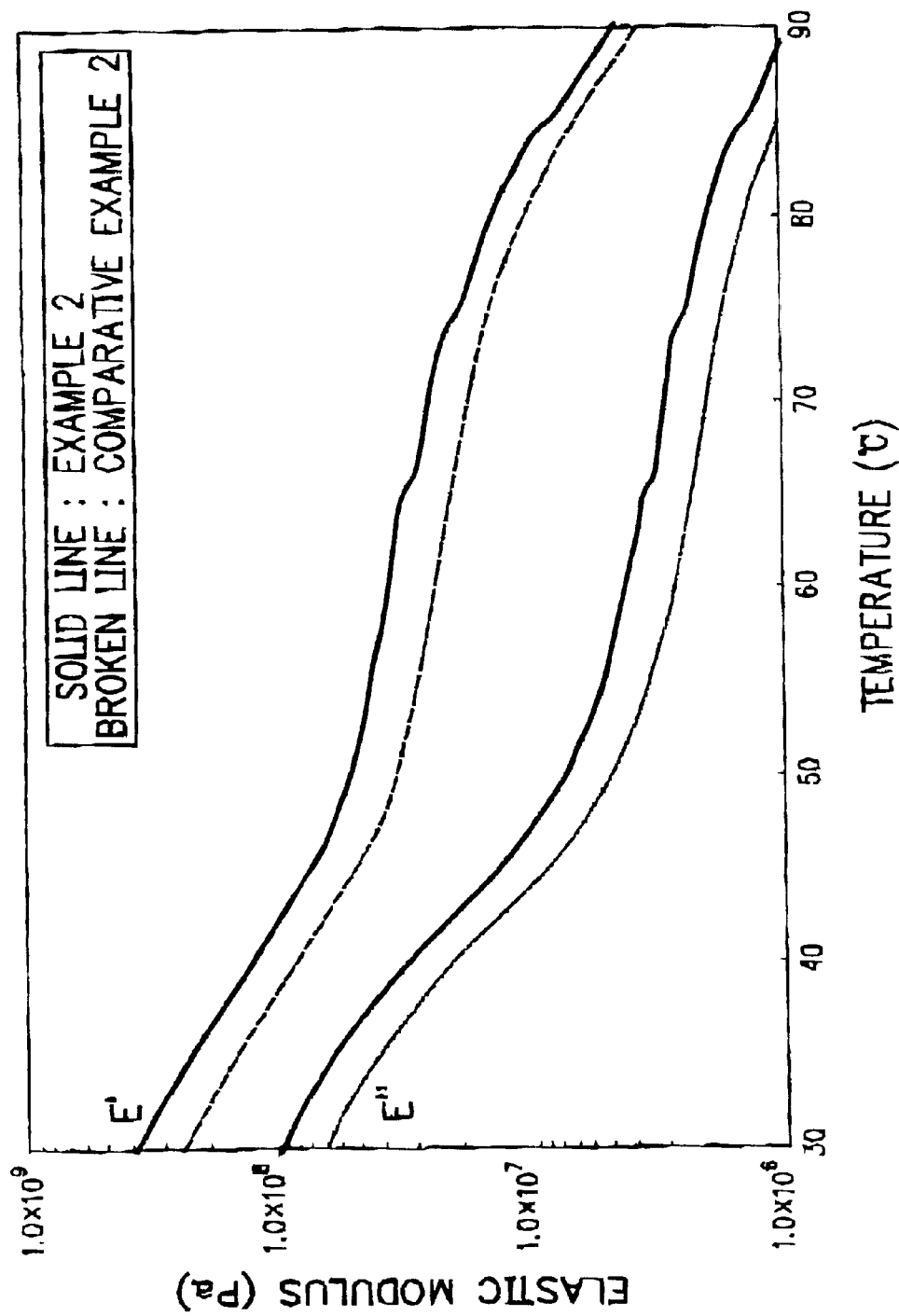
F I G. 5

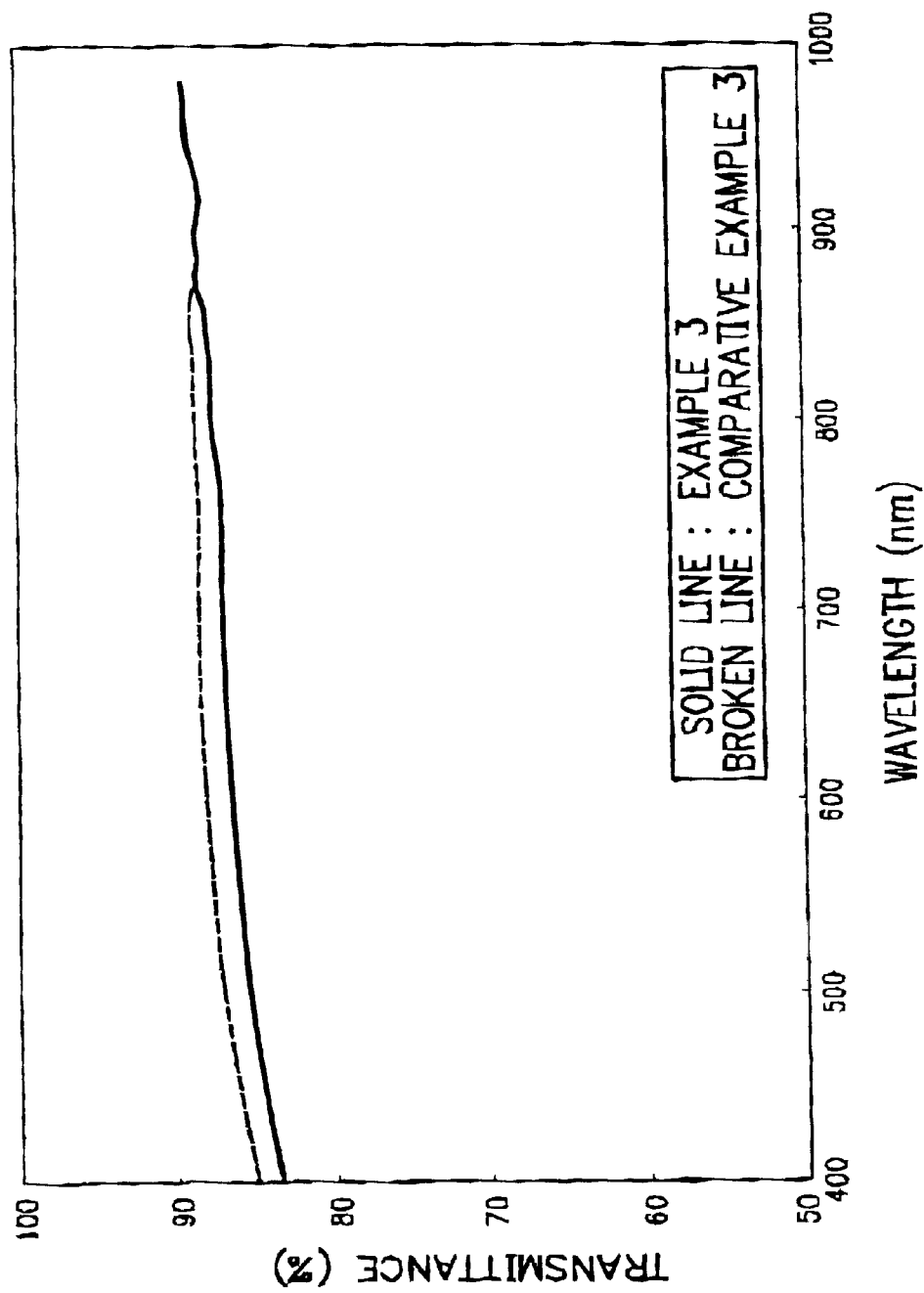

SEALING COMPOSITION FOR SEALING SOLAR CELL, AND SOLAR CELL MODULE AND BUILDING MATERIAL-INTEGRAL TYPE SOLAR CELL MODULE USING SAID COMPOSITION

BACKGROUND OF THE INVENTION

1. Field of the Invention

The present invention relates to a sealing composition for sealing a solar cell, which excels in heat resistance, impact resistance, and long reliability. The present invention also relates a solar cell module in which said sealing composition is used and a building material-integral type solar cell module in which said sealing composition is used.

2. Related Background Art

In recent years, an uprush of consciousness for the problems of pollution has been spread in the world. Among others, a sense of crisis about heating of the earth because of the so-called green house effect due to an increase of atmospheric $CO_2$ has been growing among the people. Therefore, there is an increased societal demand for early realization of a power generation system capable of providing clean energy without causing $CO_2$ build-up.

There have been various proposals which are expected to meet such societal demand. Among those proposals, solar cells are expected to be suitable as an alternative source of energy since they supply electric power without causing such problems as above mentioned, and they are safe and can be readily handled.

Such solar cell includes single crystal silicon solar cells, polycrystal silicon solar cells, amorphous silicon solar cells (including microcrystal silicon solar cells), copper-indium-selenide solar cells, and compound semiconductor solar cells. Of these solar cells, various studies have been made on so-called thin film crystal silicon solar cells, compound semiconductor solar cells and amorphous silicon solar cells since their semiconductor active layers can be relatively easily formed in a large area and in a desired form and they can be easily produced at a relatively low production cost.

Now, in the case of producing a solar cell module using any of these solar cell, it is necessary to protect the solar cell by covering the light incident side by a transparent covering material. As a typical method of producing a solar cell module in this way, it is known that a given solar cell is sealed by a sealing filler material comprising a transparent thermoplastic resin and the outermost surface side of the solar cell is covered by a surface covering material comprising a glass plate or a transparent film comprising a fluororesin or a fluororesin paint. In many cases, a glass plate is used as the surface covering material. A main reason why the glass plate is used at the outermost surface side is that the solar cell module is made to excel in weatherability and scratch resistance so that the photoelectric conversion efficiency thereof is prevented from being reduced due to a reduction in the light transmittance of the surface covering material when the surface covering material is deteriorated. Particularly in view of mechanically protecting the solar cell in the solar cell module, it can be said that the glass plate is one of the most appropriate materials to be used as the surface covering material. However, when the glass plate is used as the surface covering material, there are disadvantages such that the surface covering material is heavy, is difficult to bend, is inferior in shock resistance, and is relatively costly. Especially, when the glass plate is used as the surface covering material, it gives a serious influence to the creep resistance characteristic of the sealing filler material of the solar cell in the solar cell module, as will be described later.

On the other hand, when a flouroresin material is used as the surface covering material, there are advantages such that the surface covering material comprising the fluororesin material excels in weatherability and water-repellency, it is able to diminish a reduction in the photoelectric conversion efficiency of the solar cell module because the fluororesin material as the surface covering material is difficult to deteriorate or stain and therefore, the light transmittance thereof is difficult to decrease, and in addition, the fluororesin material excels in flexibility and is lighter than the glass plate and this situation makes it possible to obtain a solar cell module which is lightweight and excels in flexibility.

As an adhesive in order to bond such surface covering material with the solar cell in the production of a solar cell module, a sealing filler resin material which seals and protects the solar cell is used. As such filler resin material, various transparent resin compositions comprising a transparent thermoplastic resin are selectively used. Such transparent thermoplastic resin can be readily acquired at a reasonable cost and therefore, it can be used in a large amount in order to seal and protect the solar cell in the solar cell module. Specifically, as such transparent thermoplastic resin, ethylene-vinyl acetate copolymer (EVA) or polyvinyl butyral (PVB) is generally used.

However, such transparent thermoplastic resin has disadvantages such that when the solar cell module is exposed to sunlight outdoors over a long period of time (for example, over 20 years), the transparent thermoplastic resin as the sealing filler resin material of the solar cell is liable to partially gel due to continuous irradiation of ultraviolet rays, resulting in it being clouded or it is liable to yellow due to an increase in the number of conjugated double bonds in the chemical structure of the resin as a result of continuous irradiation of ultraviolet rays. The occurrence of such cloudiness or yellowing makes the transparent thermoplastic resin to be poor in the light transmittance, resulting in reducing the photoelectric conversion efficiency of the solar cell module. Especially, when the transparent thermoplastic resin comprises EVA and the solar cell module is integrated with the roof of a building and it is continuously used in sever outdoor atmosphere because the temperature of the solar cell module is elevated to a high temperature of higher than 70° C., where the EVA as the transparent thermoplastic resin of the sealing filler resin material is markedly yellowed to cause a serious problem for the photoelectric conversion efficiency of the solar cell module.

Incidentally, the organic resin such as EVA or PVB which is used as the sealing filler resin material is thermoplastic in any case, and because of this, under use condition in outdoors where the surface temperature of the solar cell module is elevated to a high temperature and as a result, the organic resin is softened to suffer creeping where the adhesion of the organic resin is diminished to often generate a so-called microdelamination phenomenon of causing peeling between the sealing filler resin material and the solar cell or the surface covering material. Further in this case, when the surface covering material comprises a resin film, a problem is liable to occur in that the resin film is softened so as to cover the solar cell and because of this, the scratch resistance of the surface covering material is diminished.

In order to solve such problems as above described, there is a proposal in that a crosslinking agent is incorporated into the sealing filler resin material comprising such transparent thermoplastic resin and the transparent thermoplastic resin of the sealing filler resin material is crosslinked by the crosslinking agent. Particularly, for instance, Japanese Patent Publication No. 60579/1983 discloses a filling adhesive sheet for a solar cell, comprising an ethylene series copolymer resin incorporated with a silane coupling agent and an organic peroxide as a crosslinking agent. In this document, it is also described that as the ethylene series copolymer resin, EVA having a vinyl acetate content of preferably less than about 40 wt. %, more preferable 20 to 40 wt. % is preferred.

However, although the EVA disclosed in the above document is good in terms of the adhesion to a glass or a fluororesin series film and it excels in flexibility, improvement of the creep resistance and the scratch resistance is not sufficiently enough. Especially for the scratch resistance of the sealing filler material, it is not sufficiently improved only by way of such heat crosslinking.

In order to improve this situation, there is known a method in which an appropriate reinforcing member comprising a nonwoven glass fiber is contained in the sealing filler material. However, such nonwoven glass fiber is usually impregnated with a binder resin. This binder resin is liable to largely contribute to making the sealing filler material to be yellowed.

In comparison with the weatherability of the thermoplastic resin as the sealing filler resin material, that of the binder resin of the nonwoven glass fiber is not so high, and the binder resin does not contain an additive capable of improving the weatherability. Therefore, the binder resin is more liable to deteriorate in comparison with the thermoplastic resin. Further, the binder resin is distinguished from the thermoplastic resin in terms of the resin kind such that they are not compatible with each other and because of this, when moisture enters in the interface between them, the deterioration of the binder resin is liable to more progress.

For instance, in the case where EVA is used as the thermoplastic resin and a polyvinyl alcohol resin is used as the binder resin of the nonwoven glass fiber, as disclosed in Japanese Unexamined Patent Publication No. 112549/1998, it is known that in accelerated weathering test such as EMMAQUA test, weatherOmeter test, strong black light test, or 150° C. heat resistance deterioration test, yellowing chiefly due to deterioration of the binder resin is occurred. Similarly, it is also known that yellowing is occurred also when a hard resin thin layer chiefly comprising an acrylic resin is provided between the surface covering material and the solar cell (or the photovoltaic element) in order to improve the scratch resistance of the solar cell module.

SUMMARY OF THE INVENTION

The present is aimed at solving the foregoing problems of the sealing material of the solar cell in the solar cell module in the prior art.

Another object of the present invention is to provide a sealing composition for a solar cell, having an improved heat resistance, an improved creep resistance, and an improved scratch resistance.

A further object of the present invention is to provide a highly reliable solar cell module in which said sealing composition is used.

A further object of the present invention is to provide a highly reliable building material-integral type solar cell module in which said sealing composition is used.

As a result of experimental studies by the present inventors in order to solve the foregoing problems in the prior art and also in order to achieve the above objects, the present inventors obtained a finding that a sealing composition as will be described below is the most appropriate in order to desirably solve the problems in the prior art.

That is, the present invention provides a sealing composition for a solar cell, comprising a polymer blend or a polymer alloy comprising at least one kind of a polyolefin series copolymer and at least one kind of a crystalline polyolefin.

It is preferred for the polyolefin series copolymer and the crystalline polyolefin to have a relationship such that the polyolefin series copolymer has a fusing point Ta by differential scanning calorimetry ("DSC") method, the crystalline polyolefin has a fusing point Tb by DSC method, and the fusing point Tb is greater than the fusing point Ta. Particularly, it is preferred that the fusing point Ta of the polyolefin series copolymer is in a range of 50 to 110° C., and the fusing point Tb of the crystalline polyolefin is in a range of from 110 to 170° C.

Specific preferable examples of the crystalline polyolefin are polyethylene, polypropylene, ethylene-propylene copolymer, ethylene series copolymer, and propylene series copolymer. The crystalline polyolefin may comprise one or more kinds of polymers selected from these.

Specific preferable examples of the polyolefin series copolymer are ethylene-vinyl acetate copolymer, ethylene-acrylate ester copolymer, ethylene-methacrylate ester copolymer, ethylene-acrylic acid copolymer, ethylene-methacrylic acid copolymer, ethylene-acrylate ester multi-copolymer, ethylene-methacrylate ester multi-copolymer, ethylene-acrylic acid multi-copolymer, and ethylene-methacrylic acid multi-copolymer.

The polyolefin series copolymer may comprise one or more kinds of copolymers selected from these.

Each of the polymer blend and the polymer alloy is preferred to have a total light transmittance of more than 80% in a wavelength region of 400 to 1000 nm at a thickness of 0.5 mm for the polymer blend or the polymer alloy when an air is made to be a reference.

In addition, each of the polymer blend and the polymer alloy is preferred to have a melt flow rate measured by a method of ASTM D-1238 as of the end of 1999 at a temperature of 190° C. and at a load of 2.16 Kg. which is in a range of from 0.1 g/10 min to 40 g/10 min.

The present invention provides a solar cell module comprising a photovoltaic element (a solar cell) arranged between a surface covering material and a back face covering material, said photovoltaic element being sealed by a sealing material between said surface covering material and said back face covering material, characterized in that said sealing material comprises aforesaid sealing composition.

The present invention provides a building material-integral type solar cell module comprising a photovoltaic element (a solar cell) arranged between a surface covering material and a back face covering material, said photovoltaic element being sealed by a sealing material between said surface covering material and said back face covering material, characterized in that said sealing material comprises aforesaid sealing composition.

BRIEF DESCRIPTION OF THE DRAWINGS

FIG. 1 is a schematic cross-sectional view illustrating an example of the structure of a solar cell module according to the present invention.

FIG. 3 shows two storage modulus curves (E') in Example 1 and Comparative Example 1 and two loss elasticity curves (E") in Example 1 and Comparative Example 1.

FIG. 5 shows two storage modulus curves (E') in Example 2 and Comparative Example 2 and two loss elasticity curves (E") in Example 2 and Comparative Example 2.

FIG. 8 shows two light transmittance curves in Example 3 and Comparative Example 3.

DESCRIPTION OF THE INVENTION AND PREFERRED EMBODIMENTS

Figure 2A:
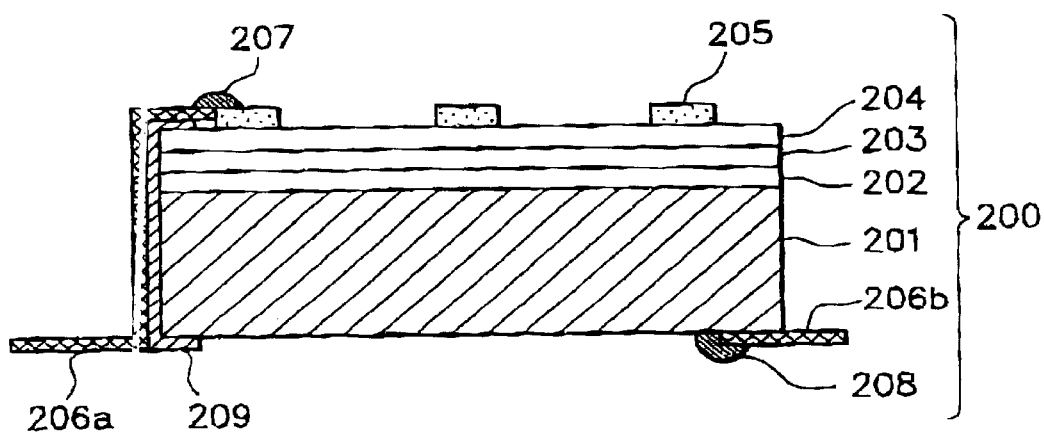
FIG. 2(a) is a schematic cross-sectional view illustrating the structure of an example of a photovoltaic element (or a solar cell) which can be used in the present invention.

As previously described, the present invention provides a sealing composition for a solar cell, comprising a polymer blend or a polymer alloy which comprises at least one kind of a polyolefin series copolymer and at least one kind of a crystalline polyolefin. The present invention also provides a solar cell module in which said sealing composition is used and a building material-integral type solar cell module in which said sealing composition is used.

A typical embodiment of the solar cell module according to the present invention comprises a photovoltaic element (a solar cell) arranged between a surface covering material and a back face covering material, said photovoltaic element being sealed by a sealing material between said surface covering material and said back face covering material, characterized in that said sealing material comprises a sealing composition comprising a polymer blend or a polymer alloy which comprises at least one kind of a polyolefin series copolymer and at least one kind of a crystalline polyolefin.

A typical embodiment of the building material-integral type solar cell module according to the present invention comprises a photovoltaic element (a solar cell) arranged between a surface covering material and a back face covering material, said photovoltaic element being sealed by a sealing material between said surface covering material and said back face covering material, characterized in that said sealing material comprises a sealing composition comprising a polymer blend or a polymer alloy which comprises at least one kind of a polyolefin series copolymer and at least one kind of a crystalline polyolefin.

The polyolefin series copolymer of the sealing composition in the present invention may comprise one or more kinds of copolymers selected from the group consisting of ethylene-vinyl acetate copolymer, ethylene-acrylate ester copolymer, ethylene-methacrylate ester copolymer, ethylene-acrylic acid copolymer, ethylene methacrylic acid copolymer, ethylene-acrylate ester multi-copolymer, ethylene-methacrylate ester multi-copolymer, ethylene-acrylic acid multi-copolymer, and ethylene-methacrylic acid multi-copolymer.

The crystalline polyolefin of the sealing composition may comprise one or more kinds of polymers selected from the group consisting of polyethylene, polypropylene, propylene-ethylene copolymer, ethylene series copolymer, and propylene series copolymer.

It is preferred for the polyolefin series copolymer and the crystalline polyolefin of the sealing composition to have a relationship such that the polyolefin series copolymer has a fusing point Ta by DSC method, the crystalline polyolefin has a fusing point Tb by DSC method, and the fusing point Ta of the polyolefin series copolymer is smaller than the fusing point Tb of the crystalline polyolefin.

And it is preferred that the fusing point Ta of the polyolefin series copolymer is in a range of from 50 to 110° C., and the fusing point Tb of the crystalline polyolefin is in a range of from 110 to 170° C.

Each of the polymer blend and the polymer alloy of the sealing composition is preferred to have a total light transmittance of more than 80% in a light wavelength of 400 to 1000 nm at a thickness of 0.5 mm for the polymer blend and the polymer alloy when an air is made to be a reference. Further, each of the polymer blend and the polymer alloy is preferred to have a melt flow rate measured by a method of ASTM D-1238 as of the end of 1999 at a temperature of 190° C. and at a load of 2.16 Kg, which is in a range of from 0.1 g/10 min to 40g/10 min.

In the following, the present invention will be detailed while referring to the drawings.

FIG. 1 is a schematic cross-sectional view illustrating the structure of an example of a solar module according to the present invention.

In FIG. 1, reference numeral 101 indicates a photovoltaic element (or a solar cell), reference numeral 102 a surface side sealing material (or a surface side filler material) which is transparent or substantially transparent, reference numeral 103 a surface covering material which is transparent or substantially transparent and which is positioned at the outermost surface, reference numeral 104 a back face side sealing material (or a back face side filler material), and reference numeral 105 a back face covering material.

In the solar cell module shown in FIG. 1, light is impinged through the side of the surface covering material 103, and the light impinged passes through the surface covering material 103 and the surface side sealing material 102 to arrive in the photovoltaic element 101. A photoelectromotive force generated in the photovoltaic element 101 is outputted through outputting terminals (not shown).

As an example of the photovoltaic element 101, there can be mentioned a photovoltaic element comprising a semiconductor active layer as a photoelectric conversion member disposed on an electrically conductive substrate.

Figure 2B:
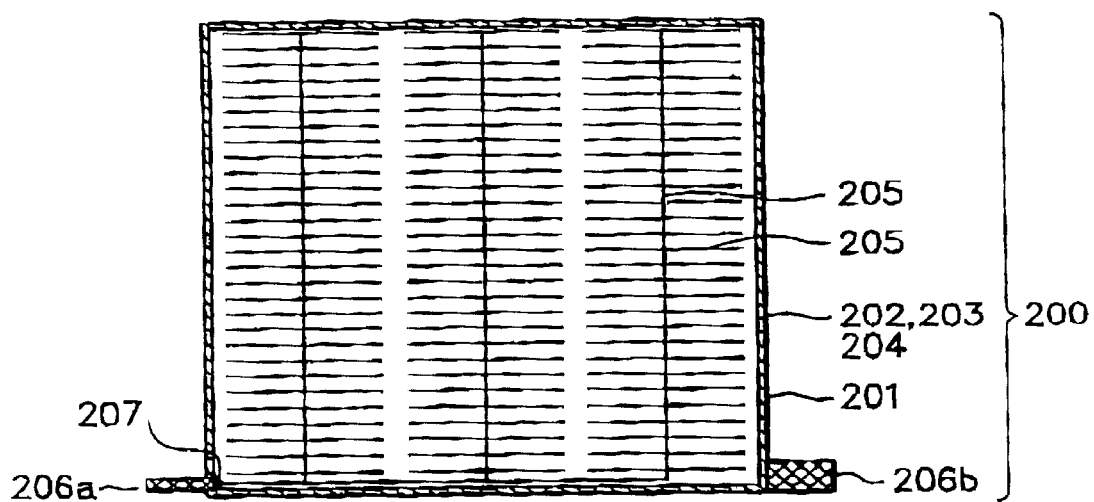
FIG. 2(b) is a schematic plan view illustrating a light receiving face of the photovoltaic element shown in FIG. 2(a).

FIG. 2(a) is a schematic cross-sectional view illustrating the structure of an example of such photovoltaic element. FIG. 2(b) is a schematic plan view illustrating a light receiving face of the photovoltaic element shown in FIG. 2(a).

In FIGS. 2(a) and 2(b), reference numeral 200 indicates the entire of a photovoltaic element, reference numeral 201 an electrically conductive substrate, reference numeral 202 a back reflecting layer, reference numeral 203 a semiconductor active layer, reference numeral 204 a transparent and electrically conductive layer, reference numeral 205 a collecting electrode (or a grid electrode), reference numeral 206a a power output terminal on the positive side, reference numeral 206b a power output terminal on the negative side, reference numeral 207 an electrically conductive adhesive, reference numeral 208 a solder, and reference numeral 209 an insulating member.

As apparent from FIGS. 2(a) and 2(b), the photovoltaic element 200 comprises the back reflecting layer 202, the semiconductor active layer 203, the transparent and electrically conductive layer 204, and the collecting electrode 205 disposed in this order on the electrically conductive substrate 201, wherein the output terminal 206a is electrically connected to the collecting electrode 205 by means of the electrically conductive adhesive 207 and it is extending from the collecting electrode 205 while being insulated by means of the insulating member 209, and the output terminal 206b is electrically connected to the electrically conductive substrate 201 by means of the solder 208. In this configuration, the positive power output terminal and the negative side power output terminal may be changed into a negative side power output terminal and a positive side power output terminal depending on the constitution of semiconductor active layer.

Each of the constituents of the solar cell module according to the present invention will be detailed.

Electrically conductive Substrate

The electrically conductive substrate 201 serves not only as a substrate for the photovoltaic element (101) but also as a lower electrode. For the electrically conductive substrate 201, there is no particular restriction as long as it has an electrically conductive surface. Specifically, it may be an electrically conductive member composed of a metal such as Ta, Mo, W, Cu, Ti, Al, or the like, or an electrically conductive member composed of an alloy of these metals as stainless steel. Besides, the electrically conductive substrate may comprise a carbon sheet or a Pb-plated steel sheet Alternatively, the electrically conductive substrate may be a film or sheet made of a synthetic resin or a sheet made a ceramic. In this case, the substrate is deposited with an electrically conductive layer on the surface thereof.

Back Reflecting Layer

The back reflecting layer 202 disposed on the electrically conductive substrate 201 may comprise a metal layer, a metal oxide layer, or a two-layered structure comprising a metal layer and a metal oxide layer. The metal layer may be composed of a metal such as Ti, Cr, Mo, W, Al, Ag, Ni, or the like. The metal oxide layer may comprise any of oxides of said metals, or other metal oxide such as ZnO, TiO2, SnO2, or the like. The back reflecting layer 202 is desired to have a roughened surface in order to make incident light to be effectively utilized.

The back reflecting layer 202 may be formed by a conventional film-forming technique such as resist heating evaporation, electron beam evaporation, or sputtering.

Semiconductor Active Layer

The semiconductor active layer 203 functions to conduct photoelectric conversion. The semiconductor active layer may be composed of a single crystal silicon semiconductor material, a non-single crystal silicon semiconductor material such as an amorphous silicon semiconductor material (including a microcrystal silicon semiconductor material) or polycrystal silicon semiconductor material, or a compound semiconductor material. In any case, the semiconductor active layer comprised of any of these semiconductor materials may be a stacked structure with a pin junction, a pn junction or a Schottky type junction. Specific examples of the compound semiconductor material are $CuInSe_2$, $CuInS_2$, GaAs, $CdS/Cu_2S$, CdS/CdTe, CdS/InP, $CdTe/Cu_2Te$, and the like.

The semiconductor active layer comprised of any of the above mentioned semiconductor materials may be formed by a conventional film-forming technique. For instance, the non-single crystal silicon semiconductor active layer may be formed by a conventional CVD (chemical vapor phase deposition) technique such as plasma CVD or photo-induced CVD using proper film-forming raw material gas capable of imparting silicon atoms such as silane gas or a conventional physical vapor phase growing technique such as sputtering using a Si-target. The semiconductor active layer composed of a polycrystal silicon semiconductor material may be formed by a conventional polycrystal silicon film-forming manner of providing a fused silicon material and subjecting the fused silicon material to film-making processing or another conventional polycrystal silicon film-forming manner of subjecting an amorphous silicon material to heat treatment. The semiconductor active layer composed of any of the above-mentioned compound semiconductor materials may be formed by conventional ion plating, ion beam deposition, vacuum evaporation, sputtering, or electrolytic technique in which a precipitate is caused by way of electrolysis of a desired electrolyte.

Transparent and Conductive Layer

The transparent and conductive layer 204 functions an upper electrode. The transparent and conductive layer may comprise $In_2O_2$, $SnO_2$, $ITO(In_2O_3-SnO_2)$, ZnO, $TiO_2$, or $Cd_2SnO_4$. Other than this, it may comprise a crystalline semiconductor layer doped with an appropriate impurity a high concentration.

The transparent and conductive layer constituted by any of the above mentioned materials may be formed by a conventional resistant heating evaporation, sputtering, spraying, or CVD. The above-described impurity-doped crystalline semiconductor layer as the transparent and conductive layer may be formed by a conventional impurity-diffusion film-forming method.

Collecting Electrode

The collecting electrode 205 (or the grid electrode) is disposed on the transparent and conductive layer 204 and it serves to effectively collect an electric current generated by virtue of a photoelectromotive force on the transparent and conductive layer 204. The collecting electrode is desired to be in the form of a comb shape. The collecting electrode may comprise a metal such as Ti, Cr, Mo, W, Al, Ag, Ni, Cu, Sn, or an alloy of these metals. Alternatively, the collecting electrode may be formed of an electrically conductive paste. The electrically conductive paste can include electrically conductive pastes comprising powdery Ag, Au, Cu, Ni, or carbon dispersed in an appropriate binder resin. The binder resin can include polyester, epoxy resin, acrylic resin, alkyd resin, polyvinyl acetate, rubber, urethane resin, and phenol resin.

The collecting electrode may be formed by sputtering using a mask pattern, resistant heating evaporation, or CVD. It may be formed by a manner of depositing a metal film over the entire surface and subjecting the metal film to etching treatment to form a desired pattern, a manner of directly forming a grid electrode pattern by means of photo-induced CVD, or manner of forming a negative pattern corresponding to a grid electrode pattern and subjecting the resultant to plating treatment. The formation of the collecting electrode using the above-described electrically conductive paste can be conducted by subjecting the electrically conductive paste to screen printing.

Power Output Terminals

The power output terminals 206a and 206b serve output an electromotive force. The output terminal 206a is electrically connected to the collecting electrode 205 by means of an electrically conductive paste 207. It is possible that the electrical connection in this case is conducted by using an appropriate connecting metal body and an electrically conductive paste or solder. The output terminal 206b is electrically connected to the electrically conductive substrate 201 by means of a solder 208. The electrical connection in this case may be conducted by spot welding or soldering an appropriate metal body such as copper tab. The power output terminal 206a on the positive side is insulated by an insulating member 209.

Separately, there are provided a plurality of photovoltaic elements having the above constitution, and they are integrated in series connection or in parallel connection depending upon a desired voltage or electric current. It is possible to dispose the integrated body on an insulating member such that a desired voltage or electric current can be obtained.

Now, description will be made of other constituents of the solar cell module shown in FIG. 1 other than the photovoltaic element.

Back Face Covering Material

The back face covering material 105 in FIG. 1 is used for the purpose of electrically isolating the electrically conductive substrate (201) of the photovoltaic element 101 from external materials. The back face covering material 105 is desired to comprise a film composed of a material capable of sufficiently electric isolating the electrically conductive substrate of the photovoltaic element and which excels in durability, withstands a thermal expansion and thermal contraction, and excels in flexibility. Such material can include glass and insulating resins. Specific examples of such insulating resin are nylon, polyethylene terephthalate (PET), and the like.

It is possible to dispose a back face reinforcing member outside the back face covering material 105, for the purpose of improving the mechanical strength of the solar cell module and preventing the solar cell module from being distorted or warped due to a change in the environmental temperature. The back face reinforcing member may comprise a steel plate, a plastic plate, or a fiber-glass reinforced plastic plate (or a so-called FRP plate).

Surface Covering Material

The surface covering material 103 is positioned at the outermost surface of the solar cell module and because of this, it is required to excel in transparency, weatherability, water repellency, heat resistance, pollution resistance and physical strength. In addition, in the case where the solar cell module is used under severe environmental conditions in outdoors, it is required for the surface covering material to be such that it ensures the solar cell module to be sufficient enough in durability upon repeated use over a long period of time.

The surface covering material 103 is preferred to comprise a resin film composed of a specific highly transparent fluororesin. Specific examples of such highly transparent fluororesin are ethylene-tetrafluoroethylene copolymer (ETFE), polyvinyl fluoride resin (PVF), polyvinylidene fluoride resin (PVDF), tetrafluoroethylene-hexafluoropropylene copolymer (FEP), and poly (chlorotrifluoroethylene) resin (PCTFE). The fluororesin film as the surface covering material 103 may contain a UV absorber dispersed therein uniformly or unevenly in the thickness direction so as to have a good ultraviolet-screening function.

It is possible for the surface covering material 103 to comprises a tempered glass which excels in light transmittance, durability and mechanical strength. However, in the case where the solar cell module is required to have flexibility, such glass material is inferior in flexibility and therefore, such resin film as above described is preferred. For the resin film, the PVDF film is excellent in view of weatherability and the ETFE film is excellent in view of weatherability and mechanical strength.

In the case where such resin film is used as the surface covering material 103, it is preferred to make the resin film have a thickness preferably in a range of from 10 to 200 $\mu$m or more preferably in a range of from 25 to 100 $\mu$m in economical viewpoint.

Separately, in order to improve the adhesion of the resin film as the surface covering material 103 with the surface side sealing material 102, it is preferred that a surface of the resin film to be contacted with the surface side sealing material is roughened by a corona treatment, a plasma treatment, or a chemical treatment.

Surface Side Sealing Material

The surface side sealing material 102 serves to cover the irregularities present at the surface of the photovoltaic element 101, to prevent the photovoltaic element from being influenced by external factors such as temperature changes or/and humidity changes in the external environment, impacts externally applied, and the like, and to ensure a sufficient adhesion between the photovoltaic element 101 and the surface covering material 103. Thus, the surface side sealing material 102 is required to excel especially in weatherability, adhesion, packing property, heat resistance, cold resistance, impact resistance, scratch resistance, and transparency. Therefore, the surface side sealing material 102 is necessary to comprise a resin material which satisfies these requirements.

In the present invention, as the surface side sealing material 102, a specific sealing composition which desirably satisfies the above requirements for the surface side sealing material 102 is used. The sealing composition typically comprises a polymer blend or a polymer alloy comprising at least one kind of a polyolefin series copolymer and at least one kind of a crystalline polyolefin. The polyolefin series copolymer of the sealing composition may comprise one or more kinds of copolymers selected from the group consisting of ethylene-vinyl acetate copolymer, ethylene-acrylate ester copolymer, ethylene-methacrylate ester copolymer, ethylene-acrylic acid copolymer, ethylene-methacrylic acid copolymer, ethylene-acrylate ester multi-copolymer, ethylene-methacrylate ester multi-copolymer, ethylene-acrylic acid multi-copolymer, and ethylene-methacrylic acid multi-copolymer which excel particularly in weatherability, adhesion, packing property, and transparency.

The polymer blend or polymer alloy is formed by compatibly resolving a crystalline polyolefin, which excels in heat resistance, impact resistance and scratch resistance, in the polyolefin series copolymer. In order to more improve the heat resistance, the impact resistance and the scratch resistance of the polyolefin series copolymer, it is preferred for the polyolefin series copolymer and the crystalline polyolefin to have a relationship such that the polyolefin series copolymer has a fusing point Ta by DSC method, the crystalline polyolefin has a fusing point Tb by DSC method, and the fusing point Tb is greater than the fusing point Ta. Particularly, it is preferred that the fusing point Ta of the polyolefin series copolymer is in a range of 50 to 110° C., and the fusing point Tb of the crystalline polyolefin is in a range of from 110 to 170° C. When the fusing point Ta of the polyolefin series copolymer is less than 50° C., there will be an occasion in that the heat resistance of the polyolefin series copolymer itself is insufficient and the effect by the polymer blend or the polymer alloy of the polyolefin series copolymer with the crystalline polyolefin cannot be sufficiently attained. When the fusing point Ta of the polyolefin series copolymer is beyond 110° C., there will be an occasion in that although the heat resistance of the polyolefin series copolymer itself is improved, the transparency thereof is diminished, and the temperature upon forming the polymer blend or the polymer alloy is heightened. Separately, when the fusing point Tb of the crystalline polyolefin is less than 110° C., it is difficult to attain an improved heat resistance by the polymer blend or the polymer alloy. When the fusing point Tb of the crystalline polyolefin is beyond 170° C., there will be an occasion in that the compatibility of the crystalline polyolefin with the polyolefin series copolymer upon forming the polymer blend or the polymer alloy is diminished to make the polymer blend or the polymer alloy to be translucent, resulting in a reduction in the light transmittance. The resultant in this case is not suitable as the sealing composition for a solar cell in the present invention.

The crystalline polyolefin of the sealing composition in the present invention may comprise one or more kinds of polymers selected from the group consisting of polyethylene, polypropylene, polybutene, modified polyolefin, ethylene series copolymer, and propylene series copolymer. Of these, polyethylene and polypropylene are more preferred for the reason that as the number of carbons per one polymer unit is increased, the compatibility with the polyolefin series copolymer is decreased. As specific examples of the polyethylene, there can be mentioned, low-density polyethylene, medium-density polyethylene, high-density polyethylene, linear low-density polyethylene, and ultra-high-molecular-weight polyethylene. As specific examples of the polypropylene, there can be mentioned isotactic polypropylene, and syndiotactic polypropylene. The polyethylene and polypropylene are not limited to these homopolymers. Copolymers comprising ethylene or propylene are also usable. As such copolymer, there can be mentioned, for example, ethylene-propylene copolymers such as ethylene-propylene block copolymer, and ethylene-propylene random copolymer.

For each of the polymer blend and the polymer alloy of the sealing composition in the present invention, when the thickness thereof is 0.5 mm, it is preferred to have a total light transmittance of more than 80% in a light wavelength region of 400 to 1000 nm when an air is made to be a reference. When the total light transmittance of the polymer blend or the polymer alloy is less than 80%, incident light is partially absorbed by the surface side sealing composition before it reaches the photovoltaic element 101, resulting in a reduction of the photoelectric conversion efficiency of the photovoltaic element. Thus, a sealing composition provided in this case is not suitable as the sealing composition for a solar cell in the present invention.

Further, the polymer blend or the polymer alloy of the sealing composition in the present invention is desired to have a refractive index preferably in a range of from 1.1 to 2.0 or more preferably in a range of from 1.1 to 1.6.

Further in addition, with respect to the flowability of each of the polymer blend and the polymer alloy, a melt flow rate as an indication index of the flowablity which is measured by a method of ASTM D-1238 at a temperature of 190° C. and at a load of 2.16 Kg is preferred to be in a range of from 0.1 g/10 min to 40 g/10 min. When the melt flow rate is less than 0.1 g/10 min, there is a tendency in that the flowability of the resin is inferior and because of this, it is difficult to sufficiently fill the irregularities present at the surface of the photovoltaic element 101, where air bubble is occurred at the surface and the like of the photovoltaic element.

Separately, by increasing the temperature in a step of covering the photovoltaic element 101, the flowability of the resin can be attained. However, in this case, a problem is liable to occur in that the surface covering material or the sealing material is yellowed to reduce the photoelectric conversion efficiency of the solar cell module. Separately, when the melt flow rate is beyond 40 g/10 min, although the flowability of the resin itself is excellent, a problem is liable to occur in that the resin is excessively fluidized and as a result, in the covering step of sealing the photovoltaic element, the resin is protruded to thin the thickness of the resin.

In order to further improve the heat resistance of the polymer blend or the polymer alloy, it is possible to crosslink the resin of the surface side sealing composition by using an organic peroxide, an alcohol, or electron beam.

Separately, in order to make the resin of the surface side sealing composition have desirable stability for high temperature, it is possible to add an antioxidant. The amount of the antioxidant to be added is preferred to be in a range of from 0.1 to 1 part by weight versus 100 parts by weight of the resin.

As the antioxidant, it is possible to selectively use the known monophenol series, bisphenol series, high molecular phenol series, sulfur series or phosphoric acid series.

Specific examples of the monophenol series are: 2,6-di-tert-butyl-p-cresol; butylic hydroxyanisole; and 2,6-di-tert-butyl-4-ethylphenol.

Specific examples of the bisphenol series are: 2,2'-methylene-bis-(4-methyl-6-tert-butylphenol); 2,2'-methylene-bis-(4-methyl-6-tert-butylphenol); 4,4'-thiobis-(3-methyl-6-tert-butylphenol); 4,4'-butylidene-bis(3-methyl-6-tert-butylphenol); and 3,9-bis-[{1,1-dimethyl-2-{β-(3-tert-butyl-4-hydroxy-5-metylphenyl)propionyloxy)ethyl}ethyl-2, 4,8,10-tetraoxaspiro]-5,5-undecane.

Specific examples of the high molecular phenol series are: 1,1,3-tris-(2-methl-4-hydroxy-5-tert-butylphenyl) butane; 1,3,5-trimethyl-2,4,6-tris(3,5-di-tert-butyl-4-hydoxybenzil) benzene; tetrakis-[methylen-3-(3',5'-di-tert-butyl-4'-hydoxyphenyl)propionate]methane; bis{(3,3'-bis-4'-hydroxy-3'-tert-butylphenyl) butylic acid}glycolester; 1,3,5-tris (3',5'-di-tert-butyl-4'-hydroxybenzil)-s-triazine-2,4,6- (1H, 3H, 5H) trione; and tocopherol (vitamin E).

Specific examples of the sulfur series are: dilaurylthiopropionate; dimyristylthiodipropionate; and distearylthiopropionate.

Specific examples of the phosphoric acid series are: triphenylphosphite; diphenylisodecylphosphite; phenyldiisodecylphosphite; 4,4'-butylidene-bis-(3-methyl-6-tert-butylphenyl-di-tridecyl) phosphite; cyclicneopentanetetrailbis(octadecylphosphite); tris(mono and/or di)phenylphosphite; diisodecylpentaerythritoldiphosphite; 9-10-dihydro-9-oxa-phosphaphenanthrene-10-oxide; 10-(3, 5-di-tert-butyl-4-hydroxybenzil)-9,10-dihydro-9-oxa-10-phosphaphenanthrene-10oxide; 10-desiloxy-9,10-dihydro-9-oxa-10-phosphaphenanthrene; cyclicneopentanetetrailbis(2, 4-di-tert-butylphenyl) phosphite; cyclicneopentanetetrailbis(2,6-di-tert-methylphenyl) phosphite; and 2,2-methylenebis(4,6-tert-butylphenyl) octylphosphite.

The sealing composition (the surface side sealing composition 102) in the present invention excels in weatherability. However, in order to further improve the weatherability and in order to protect a layer situated thereunder, it is possible for the surface side sealing material to contain an UV absorber.

The amount of the UV absorber to be added is in a range of from 0.1 to 0.5 part by weight versus 100 parts by weight of the resin of the sealing composition.

As the UV absorber, conventional absorbers can be selectively used. The conventional absorber can include salicylate series, benzophenon series, benzotriazole series, and cyanoacrylate series.

Specific examples of the salicylate series are: phenylsalicylate; p-tert-butylphenylsalicylate; and p-octylphenylsalicylate.

Specific samples of the benzophenone series are: 2-4-dihydroxybenzophenone; 2-hydroxy-4-methoxybenzophenone; 2-hydroxy-4-octoxybenzophenone; 2-hydroxy-4-dodecyloxybenzophenone; 2-2'-dihydroxy-4-methoxybenzophenone; 2,2'-dihydoxy-4,4'-dimethoxybenzophenone; 2-hydroxy-4-methoxy-5-sulfobenzophenone; and bis(2-methoxy-4-hydroxy-5-benzophenone).

Specific examples of the benzotriazole series are: 2-(2'-hydroxy-5'-methylphenyl)benzotriazole; 2-(2'-hydroxy-5'-tert-butylphenyl)benzotriazole; 2-(2'-hydroxy-3',5'-di-tert-butylphenyl)benzotriazole; 2-(2'-hydroxy-3-tert-butyl-5-methyphenyl)-5-chlorobenzotriazole; 2-(2'-hydroxy-3',5'-di-tert-butylphenyl)-5-chlorobenzotriazole; 2-(2'-hydroxy-3',5'-di-tert-amylphenyl)benzotriazole; 2-{2'-hydroxy-3'-(3",4",5",6"-tetrahydrophthalimidemethyl)-5'-methyphenyl}benzotriazole; and 2,2-methylenebis{4-(1,1, 3,3-tetramethylbutyl)-6-(2H-benzotriazole-2-i1)phenol.

Specific examples of the cyanoacrylate series are: 2-ethylhexyl-2-cyano-3,3'-diphenylacrylate; and ethyl-2-cyano-3,3'-diphenylacrylate.

One kind or more of the above-mentioned UV absorbers may be added.

To enhance the weatherability, a hindered amine series UV light stabilizer may be used, other than the above UV absorber. Differently from the UV absorber, the hindered amine series UV light stabilizer does not absorb any ultraviolet rays, but it exhibits a significant synergistic effect in combination with the UV absorber. Of course, other UV light stabilizers than the hindered amine series are known to act as the UV light stabilizer. Other UV light stabilizers are known but they are not suitable to use in the sealing composition in the present invention because they are often colored.

Specific examples of the hindered amine series UV light stabilizer usable in the present invention are: succindimethyl-1-(2-hydroxyethyl)-4-hydroxy-2,2,6, 6-tetramethylpiperidine polycondensation; poly[{6-(1,1, 3,3-tetramethylbutyl)amino-1,3,5-triazine-2,4-dii1}{(2, 2,6, 6,-tetramethyl-4-piperidyl) imino} hexamethylene {(2, 2,6, 6,-tetramethyl-4-piperidyl)imino}]; N,N'-bis(3-aminopropyl)ehtylenediamine-2,4-bis[N-butyl-N-(1,2,2,6, 6-pentamethyl-4-piperidyl) amino]-6-cloro-1,3, 5-triazine condensation; bis(2,2,6,6-tetramethyl-4-piperidyl)sebacate; and 2-(3, 5-di-tert-4-hydroxybenzil)-2-n-butylmalonic bis (1,2,2,6, 6,-pentaxnethyl-4-piperidyl).

Now, accounting for the use environment of the solar cell module, for the above-mentioned antioxidants, UV absorbers and UV light stabilizers, it is preferred to selectively use those which are volatile.

In the case where the solar cell module is considered to be used under severer environmental condition, it is desired to more improve the adhesion between the surface side sealing composition 102 and the photovoltaic element 101 or the surface covering material 103. This purpose can be attained by adding a coupling agent such as a silane coupling agent or an organic titanate to the surface side sealing composition 102. The amount of such coupling agent to be added is preferably in a range of from 0.1 to 3 parts by weight or more preferably in a range of from 0.25 to 1 part by weight, versus 100 parts by weight of the resin of the sealing composition.

Specific examples of such silane coupling agent are vinyltrichlorosilane, vinyltris(β-methoxy)silane, vinyltriethoxysilane, vinyltrimethoxysilane, γ-methacryloxypropyltrimethoxysilane, β-(3,4-epoxycyclohexyl)ethyltrimethoxysilane, γ-glycidoxypropylmethyldiethoxysilane, N-β(aminoethyl)γ-aminopropyltrimethoxysilane, N-β(aminoethyl)γ-aminopropylmethyldimethoxysilane, γ-aminopropyltriethoxysilane, N-phenyl-γ-aminopropyltrimethoxysilane, γ-mercaptopropyltrimethoxysilane, and γ-chloropropyltrimethoxysilane.

Back Face Side Sealing Material

The back face side sealing material 104 serves to ensure the adhesion between the photovoltaic element 101 and the back face covering material 105. Thus, the back face side sealing material 104 is preferred to comprise a material which can attain sufficient adhesion with the electrically conductive substrate of the photovoltaic element 101 and which excels in long time durability, withstands thermal expansion and thermal shrinkage, and has flexibility. As such material capable of being suitably used as the back face side sealing material 104, there can be mentioned a polymer blend or a polymer alloy comprising at least one kind of a polyolefin series copolymer and at least one kind of a crystalline polyolefin as well as in the case of the surface side sealing material 102. The polyolefin series copolymer may comprise one or more kinds of copolymers selected from the group consisting of ethylene-vinyl acetate copolymer, ethylene-acrylate ester copolymer, ethylene-methacrylate ester copolymer, ethylene-acrylic acid copolymer, ethylene-methacrylic acid copolymer, ethylene-acrylate ester multi-copolymer, ethylene-methacrylate ester multi-copolymer, ethylene-acrylic acid multi-copolymer, and ethylene-methacrylic acid multi-copolymer which excel particularly in weatherability, adhesion, packing property, and transparency. Being different from the surface side sealing material 102, the back face side sealing material 104 is not always necessary to have transparency, impact resistance, and scratch resistance.

Therefore, it is possible to selectively use other appropriate sealing materials. As specific examples of such sealing material, there can be mentioned ethylene-vinyl acetate copolymer, ethylene-acrylate ester copolymer, ethylene-methacrylate ester copolymer, ethylene-acrylic acid copolymer, ethylene-methacrylic acid copolymer, ethylene-acrylate ester multi-copolymer, ethylene-methacrylate ester multi-copolymer, ethylene-acrylic acid multi-copolymer, ethylene-methacrylic acid multi-copolymer, hot-melt adhesives such as polyvinyl butyral and the like, double-coated tapes, and epoxy adhesives having flexibility. However, in the case where the solar cell module is integrated with a building material, it is required also for the back face side scaling material 104 to have heat resistance because the temperature of the solar cell module reaches a high temperature of about 80° C. Therefore, the polymer blend or the polymer alloy in the present invention is preferred to be used as the back face side sealing material 104 in this case.

In the following, the present invention will be described in more detail with reference to examples. It should be understood that these examples are only for illustrative purposes and are not intended to restrict the scope of the invention.

EXAMPLE 1

Preparation of a Polymer Blend

Ethylene-vinyl acetate copolymer (vinyl acetate content: 28 wt. %) having a fusing point of 74° C. (by DSC method) and crystalline polypropylene having a fusing point of 148° C. (by DSC method) were blended at a weight ratio of 100:10 and injection-molded to obtain a polymer blend having a fusing point of 80° C. (by DSC method).

A specimen of the resultant polymer blend was subjected to measurement of a storage modulus curve (E') and a loss elasticity curve (E") in a temperature region of 30 to 90° C. at a frequency of 1 Hz using a viscoelasticity measuring device DMS6100 (produced by Seiko-Instruments Company). The measured results are shown in FIG. 3.

Figure 4:
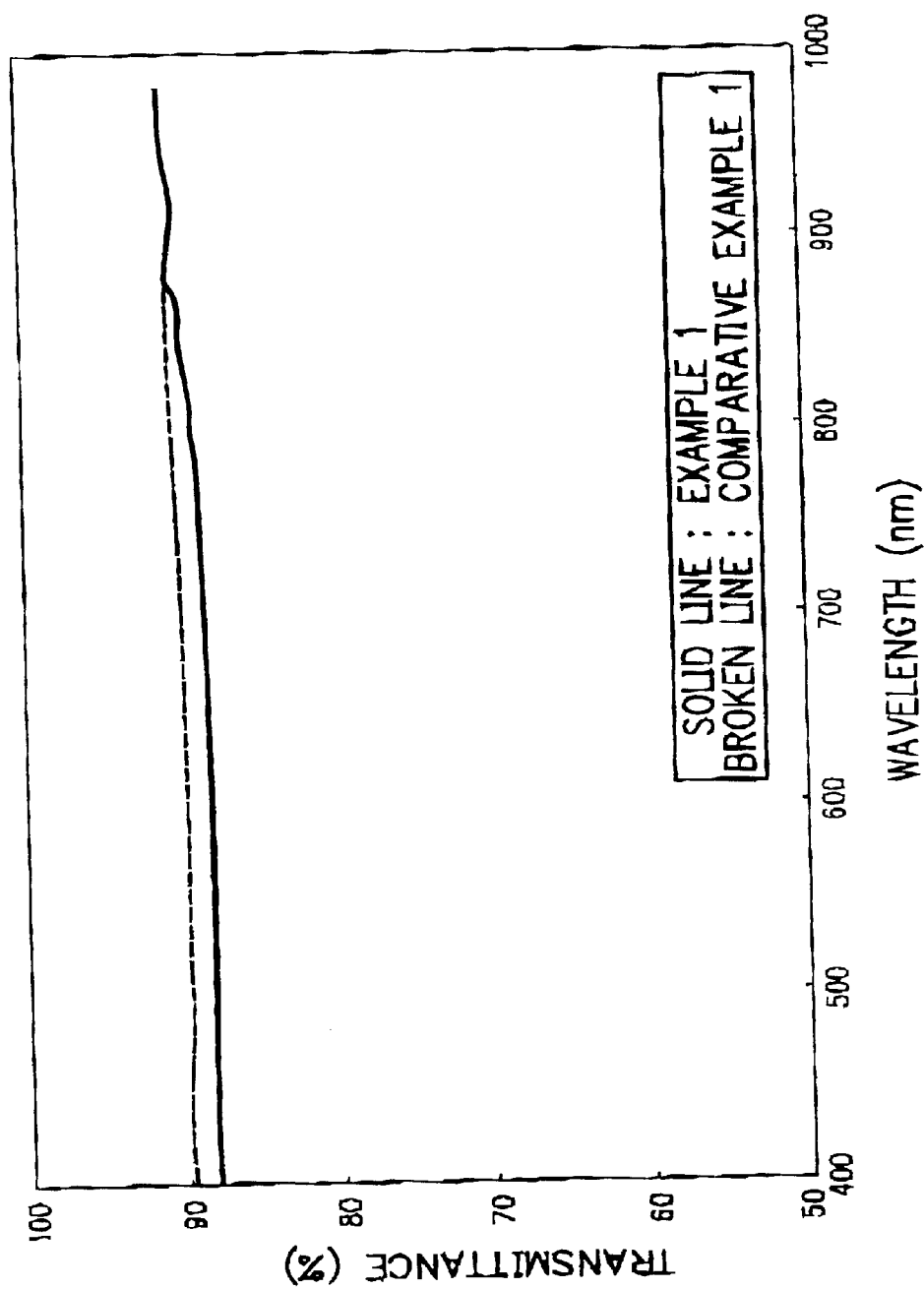
FIG. 4 shows two light transmittance curves in Example 1 and Comparative Example 1.

In addition, a specimen of the polymer blend was subjected to measurement of a total light transmittance in a light wavelength region of 400 to 1000 nm for a thickness of 0.5 mm of said specimen on the basis of JIS K 7105. The measured result is shown in FIG. 4.

EXAMPLE 2

Preparation of a Polymer Blend

Ethylene-methacrylic acid copolymer (methacrylic acid content: 15 wt. %) having a fusing point of 93° C. (by DSC method) and crystalline polyethylene having a fusing point of 118° C. (by DSC method) were blended at a weight ratio of 100:10 and injection-molded to obtain a polymer blend having a fusing point of 100° C. (by DSC method).

A specimen of the resultant polymer blend was subjected to measurement of a storage modulus curve (E') and a loss elasticity curve (E") in a temperature region of 30 to 90° C. at a frequency of 1 Hz using a viscoelasticity measuring device DMS6100 (produced be Seiko-Instruments Company). The measured results are shown in FIG. 5.

Figure 6:
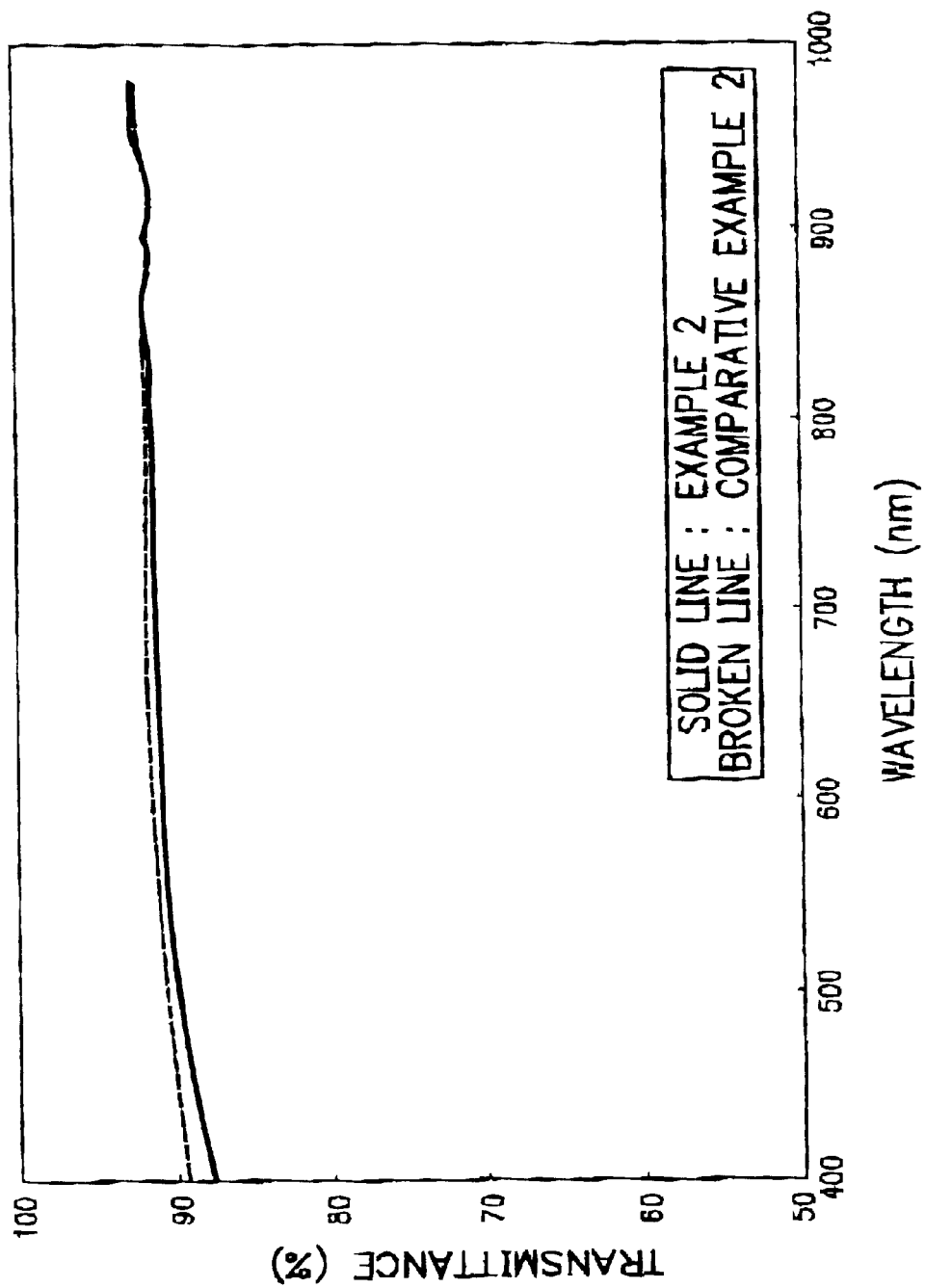
FIG. 6 shows two light transmittance curves in Example 2 and Comparative Example 2.

In addition, a specimen of the polymer blend was subjected to measurement of a total light transmittance in a light wavelength region of 400 to 1000 nm for a thickness of 0.5 mm of said specimen on the basis of JIS K 7105. The measured result is shown in FIG. 6.

EXAMPLE 3

Preparation of a Polymer Blend

Ethylene-methyl acrylate copolymer (methyl acrylate content: 20 wt. %) having a fusing point of 77° C. (by DSC method) and crystalline polypropylene having a fusing point of 159° C. (by DSC method) were blended at a weight ratio of 100:10 and injection-molded to obtain a polymer blend having a fusing point of 85° C. (by DSC method).

Figure 7:
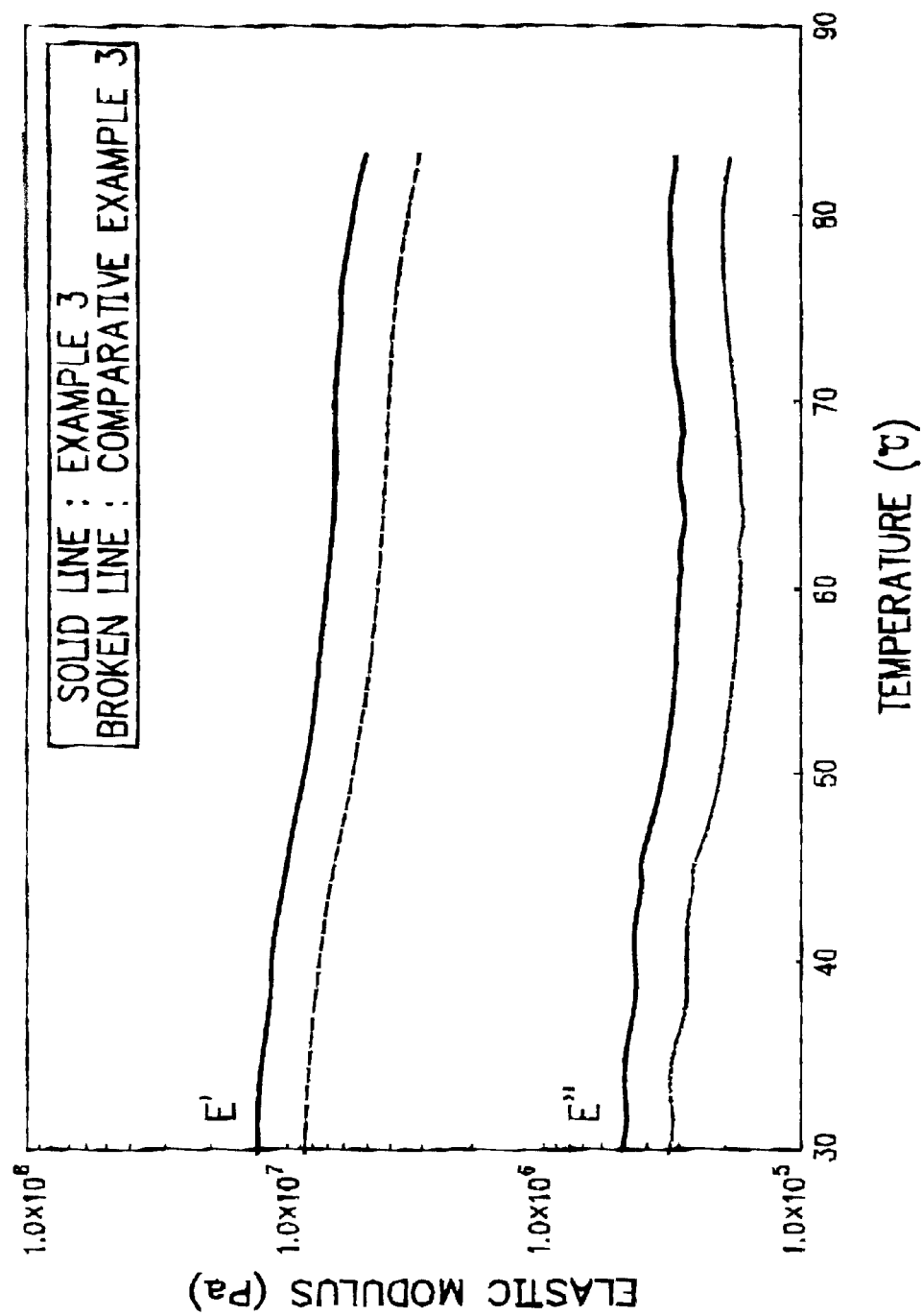
FIG. 7 shows two storage modulus curves (E') in Example 3 and Comparative Example 3 and two loss elasticity curves (E") in Example 3 and Comparative Example 3.

A specimen of the resultant polymer blend was subjected to measurement of a storage modulus curve (E') and a loss elasticity curve (E") in a temperature region of 30 to 90° C. at a frequency of 1 Hz using a viscoelasticity measuring device DMS6100 (produced by Seiko-Instruments Company). The measured results are shown in FIG. 7.

In addition, a specimen of the polymer blend was subjected to measurement of total light transmittance in a light wavelength region of 400 to 1000 nm for a thickness of 0.5 mm of said specimen on the basis of JIS K 7105. The measured result is shown in FIG. 8.

EXAMPLE 4

Preparation of a Solar Cell Module

In this example, a solar cell module having such configuration as shown in FIG. 1 was prepared using the polymer blend obtained in Example 1, as will be described below.

1. Preparation of Photovoltaic Element:

A photovoltaic element (a solar cell) having such configuration as shown in FIGS. 2(a) and 2(b) was prepared in the following manner.

There was provided a well-cleaned stainless substrate as the substrate 201. On the substrate, there was formed a two-layered back reflecting layer 202 comprising a 5000 Å thick Al film/a 5000 Å thick ZnO film by means of the conventional sputtering process.

On the back reflecting layer 202 thus formed, there was formed a tandem type photoelectric conversion semiconductor layer as the semiconductor active layer 203 comprising a 150 Å thick n-type amorphous silicon layer/a 4000 Å thick i-type amorphous silicon layer/a 100 Å thick p-type microcrystalline silicon layer/a 100 Å thick n-type amorphous silicon layer/a 800 Å thick i-type amorphous silicon layer/a 100 Å thick p-type microcrystalline silicon layer laminated in the named order from the substrate side by means of the conventional plasma CVD process, wherein each n-type amorphous silicon layer was formed using $SiH_4$ gas, $PH_3$ gas and $H_2$ gas, each i-type amorphous silicon layer was formed using $SiH_4$ gas and $H_2$ gas, and each p-type microcrystalline silicon layer was formed using $SiH_4$ gas, $BF_3$ gas and $H_2$ gas. Then, on the semiconductor active layer 203, there was formed a 700 Å thick transparent and conductive layer 204 composed of $In_2O_3$ by means of the conventional heat resistance evaporation process wherein an In source was evaporated in an $O_2$ gas atmosphere. Successively, an Ag-paste comprising powdery Ag dispersed in a polyester resin was screen-printed on the transparent and conductive layer 204, followed by drying, to form a grid electrode as the collecting electrode 205. As for resultant, a copper tub as the negative side power output terminal 206b was fixed to the substrate 201 using a stainless solder 208, and a tin foil tape as the positive side power output terminal 206a was fixed to the collecting electrode 205 using an electrically conductive adhesive 207. Thus, there was obtained a photovoltaic element 101 (a solar cell) [see, FIG. 1]. Here, the positive side power output terminal 206a was extended through an insulating member fixed to the photovoltaic element to the rear face side so that it can be taken out to the outside through a wiring hole of a back face covering member which will be described later.

2. Preparation of Solar Cell Module:

Using the photovoltaic element 101 obtained in the above step 1, there was prepared a solar cell module having such configuration as shown in FIG. 1 in the following manner.

As the surface side sealing material 102, there was provided a sealing composition obtained by blending 1.5 parts by weight of an organic peroxide as a crosslinking agent, 0.3 part by weight of an UV absorber, 0.1 part by weight of a UV light stabilizer, 0.2 part by weight of an antioxidant, and 0.125 part by weight of a silane coupling agent in 100 parts be weight of the polymer blend obtained in Example 1. As the back face side sealing material 104, there was provided a polymer blend obtained in the same manner as in Example 1. As the surface covering material 103, there was provided an ETFE film. As the back face covering material 105, there was provided a steel plate having a polyester film formed thereon and with is provided with a wiring hole.

On the steel plate as the back face covering material 105, there were laminated the polymer blend as the back face side sealing material 104, the photovoltaic element 101, the sealing composition as the surface side sealing material 102, and the ETFE film as the surface covering material 103 in this order, whereby a stacked body was obtained.

The stacked body obtained was placed in a vacuum laminator, where it was subjected to heat treatment at 150° C. for 30 minutes while evacuating the inside of the vacuum laminator to a predetermined vacuum degree, followed by cooling to room temperature. Thus, there was obtained a solar cell module.

Evaluation

For the resultant solar cell module evaluation was conducted with respect to (1) scratch resistance, (2) creep resistance, (3) weatherability, and (4) moisture resistance, for the purpose of examining the reliability of the solar cell module.

The evaluated results obtained are collectively shown in Table 1.

The evaluation of each of the above evaluation items (1) to (4) was conducted in the following manner.

(1) Evaluation of the Scratch Resistance:

In order to examine whether or not the protection ability of the surface covering material of the solar cell module to scratching from the outside, scratch test following UL1703 Standard was conducted. This scratch test is that a test machine having a rigid blade is moved on the surface of a solar cell module at a speed of 152.4 mm/second while supplying a load of 2 lb and 5 lb. Judgment of whether the result in this scratch test is good or not good is performed by conducting high voltage breakdown test, where when no leakage current is found at the solar cell module, the solar cell module is judged to be acceptable.

Description will be made of the high voltage breakdown test. First, for the solar cell module having subjected to the scratch test, the positive electrode and the negative electrode thereof are short-circuited, and the solar cell module thus short-circuited is immersed in a solution whose electric conductivity is less than 3500 Ω. cm, where the power output terminals of the solar cell module are not immersed in the solution. Then, the scratched portions of the solar cell module in the scratch test are rubbed for 10 seconds, the negative electrode of a power is electrically connected to the solution side and the positive electrode thereof is electrically connected to the power output terminal of the solar cell module, and a voltage of 2000 V from the power source is applied, where when only an electric current of less than 50 $\mu$A is flown, the solar cell module is judged to be good.

The result evaluated in this way of the solar cell module is shown in Table on the basis of the following criteria:

◯: a case where the result is good at the 5 lb load.
Δ: a case where the result is good at the 2 lb load, and
×: a case where the result is not good at the 2 lb load.

(2) Evaluation of the Creep Resistance:

The evaluation of this evaluation item was conducted in the following manner.

The solar cell module is vertically arranged in an oven maintained at 100° C. and allowed to stand as it is for one week. Thereafter, the solar cell module is taken out from the oven, and the solar cell module is examined whether it has creeping or peeling.

The result thus evaluated is shown in Table 1 on the following criteria:

◯: a case where neither creeping nor peeling are observed, and
×: a case where creeping or/and peeling are observed.

(3) Evaluation of the Weatherability:

The evaluation of this evaluation item was conducted in the following manner.

The solar cell module is placed in an UV irradiating apparatus (produced by SUGA Shikenki Kabusiki Kaisha), where for the solar cell module, a cycle test of repeating (a) a step of performing UV light irradiation of 1000 W/m$^2$ (intensity: 300 to 400 nm) in an atmosphere of black panel temperature 63° C./humidity 70% RH for 102 minutes and (b) a step of falling pure water while continuing the step (a) is conducted for 1400 hours. Thereafter, the exterior appearance of the solar cell module is observed.

The result evaluated in this way is shown in Table 1 on the basis of the following criteria:

◯: a case where no substantial change is observed for the exterior appearance of the solar cell module, and
×: a case where a change is observed for the exterior appearance of the solar cell module.

(4) Evaluation of the Moisture Resistance:

The evaluation of this evaluation item was conducted in the following manner.

The solar cell module is placed in an environmental test apparatus, where the solar cell module is maintained in an atmosphere with a temperature of 85° C. and a humidity of 85% RH for 1000 hours. Thereafter, the exterior appearance of the solar cell module is observed.

The result evaluated in this way is shown in Table 1 on the basis of the following criteria:

◯: a case where no substantial change is observed for the exterior appearance of the solar cell module, and
×: a case where a change is observed for the exterior appearance of the solar cell module.

EXAMPLE 5

The procedures of Example 4 were repeated, except that the polymer blend of the sealing composition as the surface side sealing material 102 and that of the back face side sealing material 104 in Example 4 were changed respectively to the polymer blend obtained in Example 2, to obtain a solar cell module.

The resultant solar cell module was evaluated in the same manner in Example 4.

The evaluated results obtained are collectively shown in Table 1.

EXAMPLE 6

The procedures of Example 4 were repeated, except that a tempered glass member was used as the surface covering material 103; the polymer blend of the sealing composition as the surface side sealing material 102 and that of the back face side sealing material 104 in Example 4 were changed respectively to the polymer blend obtained in Example 3; and a TEDLAR film (produced by Du Pont Company)

having an aluminum film laminated thereon was used as the back face covering material 105, to obtain a solar cell module.

The resultant solar cell module was evaluated in the same manner in Example 4. However, the evaluation of the scratch resistance was not conducted for the reason that no significant difference would not be observed because the tempered glass member was used as the surface covering material 105.

The evaluated results obtained are collectively shown in Table 1.

EXAMPLE 7

In this example, a roofing material-integral type solar cell module was prepared following the procedures of Example 4 except that the polymer blend of the sealing composition as the surface side sealing material 102 and that of the back face side sealing material 104 in Example 4 were changed respectively to the polymer blend obtained in Example 3, and a steel plate as a roofing material was used as the back face covering material 105. At the rear face of the steel plate as the back face covering material of the roofing material-integral type solar cell module, a thermal insulation material was fixed. Thereafter, the resultant roofing material-integral type solar cell module was arranged on a sheathing roof board of a building as well as in the case of forming a conventional metal roof.

For the roofing material-integral type solar cell module thus arranged on the sheathing roof board of the building where the roofing material-integral type solar cell module has been exposing to sunlight, the roof surface temperature and the surface state of the resin were observed.

The observed results will be discussed by comparing with those obtained in Comparative Example 7 which will be described later.

Comparative Example 1

For an ethylene-vinyl acetate copolymer (vinyl acetate content: 28 wt. %) having a fusing point of 74° C. (by DSC method), a specimen thereof was subjected to measurement of a storage modulus curve (E') and a loss elasticity curve (E") in a temperature region of 30 to 90° C. at a frequency of 1 Hz using a viscoelasticity measuring device DMS6100 (produced by Seiko-Instruments Company). The measured results are shown in FIG. 3.

In addition, a specimen of the ethylene-vinyl acetate copolymer was subjected to measurement of a total light transmittance in a light wavelength region of 400 to 1000 nm for a thickness of 0.5 mm of said specimen on the basis of JIS K 7105. The measured result is shown in FIG. 4.

Comparative Example 2

For an ethylene-methacrylic acid copolymer (methacrylic acid content: 15 wt. %) having a fusing point of 93° C. (by DSC method), a specimen thereof was subjected to measurement of a storage modulus curve (E') and a loss elasticity curve (E") in a temperature region of 30 to 90° C. at a frequency of 1 Hz using a viscoelasticity measuring device DMS6100 (produced by Seiko-Instruments Company). The measured results are shown in FIG. 5.

In addition, a specimen of the ethylene-methacrylic acid copolymer was subjected to measurement of a total light transmittance in a light wavelength region of 400 to 1000 nm for a thickness of 0.5 mm of said specimen on the basis of JIS K 7105. The measured result is shown in FIG. 6.

Comparative Example 3

For an ethylene-methyl acrylate copolymer (methyl acrylate content: 20 wt. %) having a fusing point of 77° C. (by DSC method), a specimen thereof was subjected to measurement of a storage modulus curve (E') and a loss elasticity curve (E") in a temperature region of 30 to 90° C. at a frequency of 1 Hz using a viscoelasticity measuring device DMS6100 (produced by Seiko-Instruments Company). The measured results are shown in FIG. 7.

In addition, a specimen of the ethylene-methyl acrylate copolymer was subjected to measurement of a total light transmittance in a light wavelength region of 400 to 1000 nm for a thickness of 0.5 mm of said specimen on the basis of JIS K 7105. The measured result is shown in FIG. 8.

Comparative Example 4

The procedures of Example 4 were repeated, except that the polymer blend of the sealing composition as the surface side sealing material 102 and that of the back face side sealing material 104 in Example 4 were changed respectively to the ethylene-vinyl acetate copolymer in Comparative Example 1, to obtain a solar cell module.

The resultant solar cell module was evaluated in the same manner in Example 4.

The evaluated results obtained are collectively shown in Table 1.

Comparative Example 5

The procedures of Example 4 were repeated, except that the polymer blend of the sealing composition as the surface side sealing material 102 and that of the back face side sealing material 104 in Example 4 were changed respectively to the ethylene-methacrylic acid copolymer in Comparative Example 2, to obtain a solar cell module.

The resultant solar cell module was evaluated in the same manner in Example 4.

The evaluated results obtained are collectively shown in Table 1.

Comparative Example 6

The procedures of Example 4 were repeated, except that a tempered glass member was used as the surface covering material 103; the polymer blend of the sealing composition as the surface side sealing material 102 and that of the back face side sealing material 104 in Example 4 were changed respectively to the ethylene-methyl acrylate copolymer in Comparative Example 3; and a TEDLAR film (produced by Du Pont Company) having an aluminum film laminated thereon was used as the back face covering material 105, to obtain a solar cell module.

The resultant solar cell module was evaluated in the same manner in Example 4. However, the evaluation of the scratch resistance was not conducted for the reason that no significant difference would not be observed because the tempered glass member was used as the surface covering material 105.

The evaluated results obtained are collectively shown in Table 1.

Comparative Example 7

In this example, a roofing material-integral type solar cell module was prepared following the procedures of Example 4 except that the polymer blend of the sealing composition as the surface side sealing material 102 and that of the back face side sealing material 104 in Example 4 were changed respectively to the ethylene-methyl acrylate copolymer in Comparative Example 3, and a steel plate as a roofing material was used as the back face covering material 105. At the rear face of the steel plate as the back face covering material of the roofing material-integral type solar cell module, a thermal insulation material was fixed. Thereafter, the resultant roofing material-integral type solar cell module was arranged on a sheathing roof board of a building as well as in the case of forming a conventional metal roof.

For the roofing material-integral type solar cell module thus arranged on the sheathing roof board of the building where the roofing material-integral type solar cell module has been exposing to sunlight, the roof surface temperature and the surface state of the resin were observed.

The observed results obtained in this comparative example were compared with those obtained in Example 7. The compared results will be discussed later.

Now, as will be understood with reference to FIGS. 3, 5 and 7, any of the polymer blends obtained in Examples 1 to 3 each as a sealing composition for a solar cell in the present invention has an improvement in terms of the storage modulus (E') and the loss elasticity (E") since each of the polymer blends is one obtained by blending a specific crystalline polyolefin in a specific polyolefin series copolymer. And each of the polymer blends exhibits improved mechanical characteristics in comparison with the case where the polyolefin series copolymer is independently used.

In addition, as will be understood with reference to FIGS. 4, 6, and 8, by blending the crystalline polyolefin in the polyolefin series copolymer, it is possible to obtain a polymer blend excelling in transparency and a desirable sealing composition comprising said polymer blend where the transparency of the polymer blend is not hindered and which suitable for sealing a solar cell (a photovoltaic element).

Separately, from the results shown in Table 1, the following facts are understood.

The solar cell modules in which the polymer blends are used and the solar cell modules in which only the polyolefin series copolymers are used are satisfactory in terms of the weatherability and the moisture resistance. However, the former is apparently superior to the latter in terms of the scratch resistance and the creep resistance. For the reason for this, it is considered such that the characteristics of the crystalline polyolefin having heat resistance and mechanical strength are reflected to the polyolefin series copolymer and this situation makes the sealing composition comprising the polymer blend contribute to an improvement in the scratch resistance and the creep resistance of the solar cell module.

Now, description will be made of the observed results obtained in Example 7 and Comparative Example 7. In each of Example 7 and Comparative Example 7, the roof surface temperature reached 84° C. at the highest. Thereafter, the roof surface was examined. As a result, no substantial change was observed for the exterior appearance in Example 7, but in Comparative Example 7, it was found that the resin laid on the roof surface was distorted into a waved form. For the reason for this, it is considered such that in Example 7, the characteristics of the crystalline polyolefin having heat resistance and mechanical strength are reflected to the polyolefin series copolymer and this situation makes the sealing composition comprising the polymer blend contribute to an improvement in the heat resistance and the creep resistance and as a result, the roofing material-integral type solar cell module is able to endure severer high temperature environment. For the roofing material-integral type solar cell module of Comparative Example 7, only the polyolefin series copolymer was used as the surface side sealing material, therefore, it is considered such that such effects as in Example 7 to improve the heat resistance and the creep resistance are not provided and because of this, the roofing material-integral type solar cell module can not desirably endure severer high temperature environment, where the resin of the roof surface is distorted.

From the above description, the following facts are understood.

The present invention makes it possible to obtain a sealing composition for a solar cell, comprising a polymer blend or a polymer alloy comprising a polyolefin series copolymer excelling in weatherability and transparency and a crystalline polyolefin having heat resistance and mechanical strength, and which excels in weatherability, transparency, heat resistance, and mechanical strength.

The present invention makes it possible to produce a highly reliable solar cell module in which said sealing composition is used and which has improved heat resistance, improved creep resistance, and improved scratch resistance.

The present invention also makes it possible to produce a highly reliable building material-integral type solar cell module in which said sealing composition is used and which can desirably endure severer use environmental conditions.

TABLE 1

| | corresponding comparative example | evaluation items | | | |
|---|---|---|---|---|---|
| | | scratch resistance | creep resistance | weatherability | moisture resistance |
| Example 4 | Comparative Example 4 | O | O | O | O |
| Example 5 | Comparative Example 5 | O | O | O | O |
| Example 6 | Comparative Example 6 | not practiced | O | O | O |
| Comparative Example 4 | — | X | O | O | O |
| Comparative Example 5 | — | Δ | X | O | O |
| Comparative Example 6 | — | not practiced | X | O | O |

What is claimed is:

1. A solar cell module comprising a photovoltaic element arranged between a surface covering material and a back face covering material, said photovoltaic element being sealed by a sealing material between said surface covering material and said back face covering material, wherein said sealing material consists of a sealing composition consisting of a polymer blend or a polymer alloy, said polymer blend or said polymer alloy consisting of one polyolefin series copolymer and one crystalline polyolefin, and wherein said polyolefin series copolymer has a fusing point Ta by a differential scanning calorimetry (DSC) which falls in a range of from 50 to 110° C. and said crystalline polyolefin has a fusing point Tb by a differential scanning calorimetry (DSC) which falls in a range of from 110 to 170° C., and said one polyolefin series copolymer is selected from the group consisting of ethylene-vinyl acetate copolymer, ethylene-acrylate ester copolymer, ethylene-methacrylate ester copolymer, ethylene-acrylic acid copolymer, ethylene-methacrylic acid copolymer, ethylene-acrylate ester multi-copolymer, ethylene-methacrylate ester multi-copolymer, ethylene-acrylic acid multi-copolymer, and ethylene-methacrylic acid multi-copolymer.

2. A solar cell module according to claim 1, wherein said fusing point Ta of said polyolefin series copolymer is smaller than said fusing point Tb of said crystalline polyolefin.

3. A solar cell module according to claim 1, wherein said crystalline polyolefin comprises one or more polymers selected from the group consisting of polyethylene, polypropylene, propylene-ethylene copolymer, ethylene series copolymer, and propylene series copolymer.

4. A solar cell module according to claim 1, wherein said polymer blend or said polymer alloy has a total light transmittance of more than 80% in a light wavelength of 400 to 1000 nm at a thickness of 0.5 mm for said polymer blend or said polymer alloy when air is made to be a reference.

5. A solar cell module according to claim 1, wherein said polymer blend or said polymer alloy has a melt flow rate measured at a temperature of 190° C. and at a load of 2.16 Kg, which is in a range of from 0.1 g/10 min to 40 g/10 min.

6. A building-integrated solar cell module comprising a photovoltaic element arranged between a surface covering material and a back face covering material, said photovoltaic element being sealed by a sealing material between said surface covering material and said back face covering material, wherein said sealing material consists of a sealing composition consisting of a polymer blend or a polymer alloy, said polymer blend or said polymer alloy consisting of one polyolefin series copolymer and one crystalline polyolefin, and wherein said polyolefin series copolymer has a fusing point Ta by a differential scanning calorimetry (DSC) which falls in a range of from 50 to 110° C. and said crystalline polyolefin has a fusing point Tb by a differential scanning calorimetry (DSC) which falls in a range of from 110 to 170° C., and said one polyolefin series copolymer is selected from the group consisting of ethylene-vinyl acetate copolymer, ethylene-acrylate ester copolymer, ethylene-methacrylate ester copolymer, ethylene-acrylic acid copolymer, ethylene-methacrylic acid copolymer, ethylene-acrylate ester multi-copolymer, ethylene-methacrylate ester multi-copolymer, ethylene-acrylic acid multi-copolymer, and ethylene-methacrylic acid multi-copolymer.

7. A building-integrated solar cell module according to claim 6, wherein said fusing point Ta of said polyolefin series copolymer is smaller than said fusing point Tb of said crystalline polyolefin.

8. A building-integrated solar cell module according to claim 6, wherein said crystalline polyolefin comprises one or more polymers selected from the group consisting of polyethylene, polypropylene, propylene-ethylene copolymer, ethylene series copolymer, and propylene series copolymer.

9. A building-integrated solar cell module according to claim 6, wherein said polymer blend or said polymer alloy has a total light transmittance of more than 80% in a light wavelength of 400 to 1000 nm at a thickness of 0.5 mm for said polymer blend or said polymer alloy when air is made to be a reference.

10. A building-integrated solar cell module according to claim 6, wherein said polymer blend or said polymer alloy has a melt flow rate measured at a temperature of 190° C. and at a load of 2.16 Kg, which is in a range of from 0.1 g/10 min to 40 g/10 min.

* * * * *